(12) United States Patent
Park et al.

(10) Patent No.: US 7,914,843 B2
(45) Date of Patent: Mar. 29, 2011

(54) SLIT COATER HAVING PRE-APPLYING UNIT AND COATING METHOD USING THE SAME

(75) Inventors: Jeong Kweon Park, Gyeongsangbuk-Do (KR); Kang Il Cho, Gyeonggi-Do (KR); Seong Kwon, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 1247 days.

(21) Appl. No.: 11/211,213

(22) Filed: Aug. 19, 2005

(65) Prior Publication Data

US 2006/0147619 A1    Jul. 6, 2006

(30) Foreign Application Priority Data

Dec. 31, 2004  (KR) .................. 10-2004-0118358

(51) Int. Cl.
  *B05D 5/06*  (2006.01)
  *B05D 1/02*  (2006.01)
  *B05B 15/02*  (2006.01)
(52) U.S. Cl. ....... 427/58; 427/427; 427/427.3; 118/302; 118/323; 239/106; 239/114; 239/120
(58) Field of Classification Search .................. 118/302, 118/323; 239/106, 114, 120; 427/427, 427.3, 427/58

See application file for complete search history.

(56) References Cited

U.S. PATENT DOCUMENTS

| | | | |
|---|---|---|---|
| 5,167,837 A | 12/1992 | Snodgrass et al. |
| 6,319,323 B1 | 11/2001 | Gibson et al. |
| 6,475,282 B1 | 11/2002 | Snodgrass et al. |
| 6,488,041 B1 | 12/2002 | Gibson et al. |
| 6,540,833 B1 | 4/2003 | Gibson et al. |
| 6,548,115 B1 | 4/2003 | Gibson et al. |
| 2001/0032585 A1* | 10/2001 | Koehn et al. ......... 118/304 |

FOREIGN PATENT DOCUMENTS

| | | |
|---|---|---|
| JP | 64-032680 | 2/1989 |
| JP | 01-164474 | 6/1989 |
| JP | 07-080385 | 3/1995 |
| JP | 07-171479 | 7/1995 |
| JP | 07-185434 | 7/1995 |

(Continued)

OTHER PUBLICATIONS

English machine translation of JP 2004-167476; 2004.*

(Continued)

*Primary Examiner* — Timothy H Meeks
*Assistant Examiner* — James Lin
(74) *Attorney, Agent, or Firm* — Brinks Hofer Gilson & Lione

(57) ABSTRACT

A slit coater having a pre-applying unit and a coating method using the same that minimizes the amount of washing solution used and improves the washing effectiveness of a roller by separating the coating solution attached to a pre-applying roller from the washing solution using a coating solution separating apparatus. The slit coater includes: a table on which an object to be processed is mounted; a slit nozzle applying coating solution onto a surface of the object; a pre-applying unit to which the slit nozzle pre-applies the coating solution; and a coating solution separating unit that separates the coating solution spread when the coating solution is pre-applied to the slit nozzle and discharges the separated coating solution.

5 Claims, 4 Drawing Sheets

FOREIGN PATENT DOCUMENTS

| | | |
|---|---|---|
| JP | 07-185437 | 7/1995 |
| JP | 07-326564 | 12/1995 |
| JP | 08-150359 | 6/1996 |
| JP | 08-155365 | 6/1996 |
| JP | 08-173878 | 7/1996 |
| JP | 09-131561 | 5/1997 |
| JP | 09-164357 | 6/1997 |
| JP | 09-192566 | 7/1997 |
| JP | 09-206652 | 8/1997 |
| JP | 09-237748 | 9/1997 |
| JP | 09-271705 | 10/1997 |
| JP | 09-330876 | 12/1997 |
| JP | 10-156255 | 6/1998 |
| JP | 10-308338 | 11/1998 |
| JP | 11-154641 | 6/1999 |
| JP | 11-274071 | 10/1999 |
| JP | 2000-005683 | 1/2000 |
| JP | 2000-135463 | 5/2000 |
| JP | 2000-167469 | 6/2000 |
| JP | 2000-288488 | 10/2000 |
| JP | 2001-103202 | 4/2001 |
| JP | 2001-310147 | 11/2001 |
| JP | 2001-310152 | 11/2001 |
| JP | 2002-015664 | 1/2002 |
| JP | 2002-066432 | 3/2002 |
| JP | 2002-066487 | 3/2002 |
| JP | 2002-113411 | 4/2002 |
| JP | 2002-204996 | 7/2002 |
| JP | 2002-282760 | 10/2002 |
| JP | 2002-346453 | 12/2002 |
| JP | 2003-093944 | 4/2003 |
| JP | 2003-236435 | 8/2003 |
| JP | 2003-245591 | 9/2003 |
| JP | 2004-154715 | 6/2004 |
| JP | 2004-167476 | 6/2004 |
| JP | 2004-202452 | 7/2004 |
| JP | 2005-177707 | 7/2005 |
| KP | 1019940000157 | 1/1994 |
| KP | 1019950030213 | 11/1995 |
| KP | 101996005857 | 2/1996 |
| KP | 101996021170 | 7/1996 |
| KP | 1019970701099 | 3/1997 |
| KP | 1019970051813 | 7/1997 |
| KP | 1019970063518 | 9/1997 |
| KP | 1019970072019 | 11/1997 |
| KP | 101998063704 | 10/1998 |
| KP | 1019980087322 | 12/1998 |
| KP | 101999029827 | 4/1999 |
| KP | 1020010006575 A | 1/2001 |
| KP | 1020010086065 | 7/2001 |
| KP | 1020020018973 A | 3/2002 |
| KP | 1020020018974 A | 3/2002 |
| KP | 1020020019406 A | 3/2002 |
| KP | 1020020028829 A | 4/2002 |
| KP | 1020020029323 A | 4/2002 |
| KP | 1020020077814 A | 10/2002 |
| KP | 1020020080440 | 10/2002 |
| KP | 1020030003114 A | 1/2003 |
| KP | 1020030011462 A | 2/2003 |
| KP | 1020030011463 A | 2/2003 |
| KP | 1020030045636 A | 6/2003 |
| KP | 2004-41012 | 5/2004 |
| TW | 512072 | 12/2002 |

OTHER PUBLICATIONS

English machine translation of JP 2001-310147; 2001.*
Partial translation of JP 2004-167476 (2004).*
First Notification of Office Action for corresponding Chinese Patent Application Serial No. 200510137815.5, dated Dec. 14, 2007.
Office Action issued in corresponding Chinese Patent Application No. 200510137815.5; issued May 30, 2008.
Office Action issued in corresponding Japanese Patent Application No. 2005-322466; issued Jul. 8, 2008.
Office Action issued in corresponding Taiwanese Patent Application No. 094144271; issued Sep. 15, 2008.
Office Action dated Sep. 26, 2006 for corresponding Korean Patent Application No. 10-2004-0118358.

* cited by examiner

SLIT COATER HAVING PRE-APPLYING UNIT AND COATING METHOD USING THE SAME

PRIORITY CLAIM

This application claims priority to Korean patent application No. 118358/2004, filed Dec. 31, 2004 the disclosure of which is incorporated by reference herein.

TECHNICAL FIELD

The present invention relates, generally, to a slit coater and, more particularly, to a slit coater and a coating method using the same for applying coating solution such as a photosensitive solution, a developer solution, and a color filter onto an object to be processed such as a semiconductor wafer, a glass substrate or a plastic substrate of a flat panel display (FPD) device.

BACKGROUND

When a flat panel display device or a semiconductor device is fabricated, a process for depositing a thin film, a photolithography process for exposing a region selected in the thin film and an etching process for removing the thin film of the selected region are performed several times. Particularly, the photolithography process includes a coating process for forming a photosensitive film of a photosensitive solution such as photoresist on a substrate or a wafer, and an exposing and developing process for patterning the photosensitive film by using a mask with a predetermined pattern.

In general, a spray coating method, a roll coating method, a spin coating method or the like is used in the coating process for forming a photosensitive film on a substrate and a wafer.

Because the spray coating method and the roll coating method are not suitable to achieve high precision in the uniformity of a coating film and the adjustment of a thickness of the film, the spin coating method is used for high-precision pattern formation.

A spin coater used in the spin coating method will now be described in detail with reference to accompanying drawings.

FIG. 1 is a sectional view which illustrates a structure of a general spin coater.

As shown, the spin coater includes a spin chuck 5 that is connected to a rotating shaft 6. A cover 7 that surrounds the spin chuck 5 and can be opened and closed. A nozzle 4 is placed above the spin chuck 5 and moves into the cover 7 when the cover 7 is opened.

An object 10 to be processed and be coated with a photosensitive film is mounted on the spin chuck 5, and a drain valve (not shown) for discharging photosensitive solution such as photoresist to the outside is installed at a lower portion of the cover 7.

In order to form a coating film on the predetermined object 10, first, the nozzle 4 of the spin coater having the aforementioned structure is lowered and sprays photosensitive solution onto a surface of the object 10, which has been placed on the spin chuck 5.

When the photosensitive solution is sprayed onto the object 10, the cover 7 is hermetically closed, a motor (M) is rotated, and the rotating shaft 6 connected thereto is rotated, thereby rotating the spin chuck 5 with the object 10 a certain number of times.

When the spin chuck 5 is rotated, the photosensitive solution on the surface of the object 10 is spread out by a centrifugal force, thereby applying the photosensitive solution over an entire surface of the object 10.

After the photosensitive solution is applied over the entire surface of the object 10, the applied photosensitive solution is hardened. Then, a predetermined pattern is formed on the surface of the object 10 through exposure and development using a photo mask or the like.

Although the spin coating method using the spin coater is suitable to coat a small object, such as a wafer with a photosensitive film, it is not suitable to coat a large and heavy substrate, such as a flat panel display device having a glass substrate for a liquid crystal display panel with a photosensitive film.

This is because it gets harder to rotate a substrate at a high speed as the substrate gets larger and heavier. Further, damage to the substrate can occur and much energy is consumed when the substrate is rotated at a high speed.

Also, the spin coating method is disadvantageous in that a considerable amount of photosensitive solution is wasted in comparison with the amount of photosensitive solution used in the photolithography process. In particular, a large amount of photosensitive solution is dispersed outside the spin chuck at the time of high-speed rotation, and is wasted. Substantially, the amount of wasted solution is much larger than the amount of solution used for the coating, and the dispersed photosensitive solution may form particles that contaminate the photoresist following thin film forming processes. The particles can also cause environmental pollution.

BRIEF SUMMARY

To achieve these and other advantages and in accordance with the present invention, as embodied and broadly described herein, there is provided a slit coater comprising: a table on which an object to be processed is mounted; a slit nozzle configured to apply a coating solution onto a surface of the object; a pre-applying unit in which the slit nozzle pre-applies the coating solution; and a coating solution separating unit configured to separate the pre-applied coating solution and to discharge the pre-applied coating solution.

To achieve these and other advantages and in accordance with the present invention, as embodied and broadly described herein there is provided a method for fabricating an LCD substrate using a slit coat. The method includes providing a table on which an object to be processed is mounted and providing a slit nozzle configured to apply a coating solution onto a surface of an LCD substrate. A pre-applying unit is provided that includes a washing container filled with washing solution, a rotating roller disposed in the washing container and configured to receive pre-applied coating solution from the slit nozzle, and first, second, and third washing solution spray nozzles each configured to spray washing solution to one side, the opposite side, and a lower surface, respectively, of the rotating roller. A coating solution separating unit is provided in the pre-applying unit, wherein one end portion of the coating solution separating unit is adjacent to a surface of the rotating roller and configured to separate the coating solution on the surface of the rotating roller from the washing solution and to discharge the separated coating solution. A washing solution supply unit is provided that is configured to supply the washing solution to the pre-applying unit. The slit coater applies the coating solution to the LCD substrate.

In accordance with another aspect of the invention, a method for fabricating an LCD device includes loading a substrate on a table of a slit coater, wherein the slit coater includes a slit nozzle and moving the slit nozzle to a pre-applying unit and pre-applying coating solution. The method further includes separating and discharging the pre-applied coating solution. The slit nozzle is moved to the substrate, and the substrate is coated with the coating solution using the slit nozzle.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a unit of this specification, illustrate embodiments of the invention and together with the description serve to explain the principles of the invention.

In the drawings.

DETAILED DESCRIPTION

Reference will now be made in detail to the preferred embodiments of the present invention, examples of which are illustrated in the accompanying drawings.

In general, as mentioned above, a photolithography process is required in the field of semiconductor manufacture and the field of flat panel display device in order to pattern a thin film performing a specific function, for example, an insulation film, a metal thin film, a semiconductor thin film or the like, into a desired form. Here, photosensitive solution such as photoresist, which chemically reacts to light, is used in the photolithography process.

A photosensitive film having a uniform thickness should be formed on a substrate on which a thin film has been formed, so that a defect does not occur during the process. For example, if the photosensitive film has a thickness greater than a designated thickness, a portion of the thin film which should be etched is not etched, and if the photosensitive film has a thickness smaller than the designated thickness, the thin film is excessively etched.

Also, the uniform application of the photosensitive solution has become one of the most important issues as the substrate becomes larger due to an increase in size of the liquid crystal display panel of a liquid crystal display (LCD) device.

In accordance with the invention, a nozzle method in which a certain amount of photosensitive solution is applied by using a slit nozzle is employed in place of a spinner. A coating apparatus employing such a nozzle method is referred to as a spinless coater because a spinner is not used. Alternatively, the term "slit coater" is used because photosensitive solution is applied through a slit. The slit coater supplies the photosensitive solution through a nozzle having a slit shape with a length longer than its width, and applies the photosensitive solution onto a surface of a substrate in a plane form, which makes the slit coater suitable to apply the photosensitive solution to a large LCD device.

Figure 1:
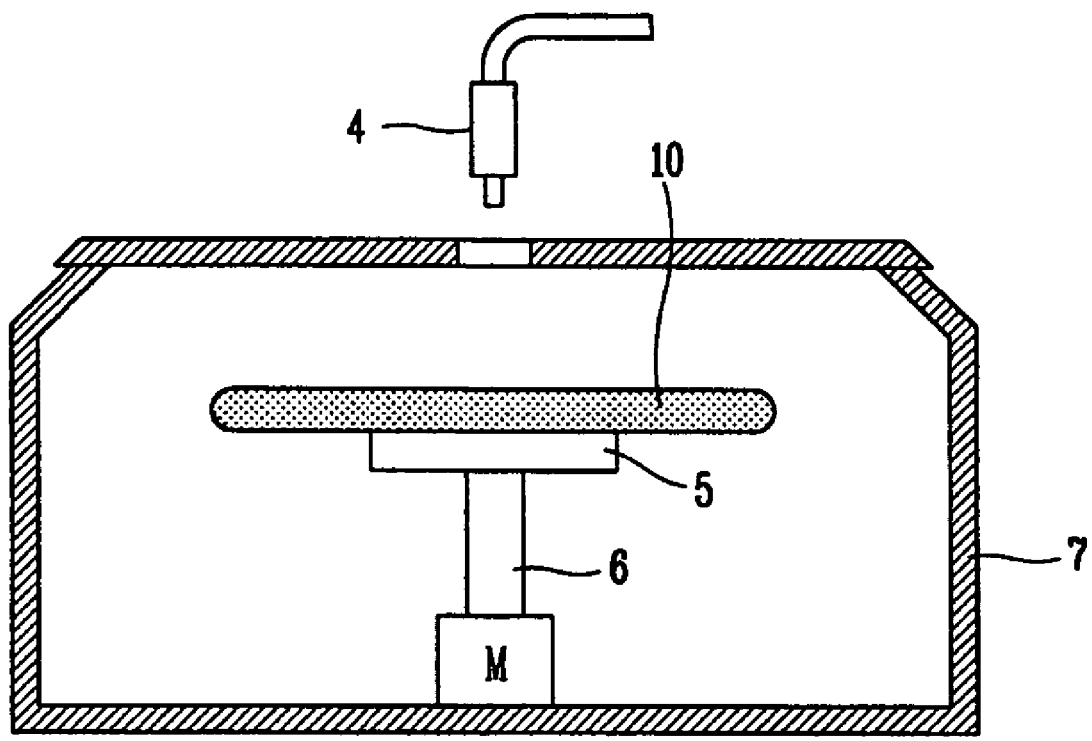
FIG. 1 is a sectional view which illustrates a structure of a general spin coater.
Figure 2A:
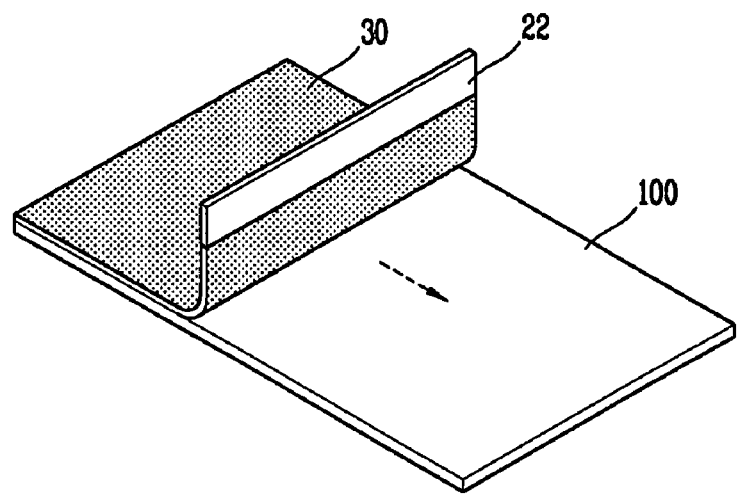
FIGS. 2A and 2B are perspective views which illustrate a basic concept of the slit coater and application of photosensitive solution by the slit coater.
Figure 2B:
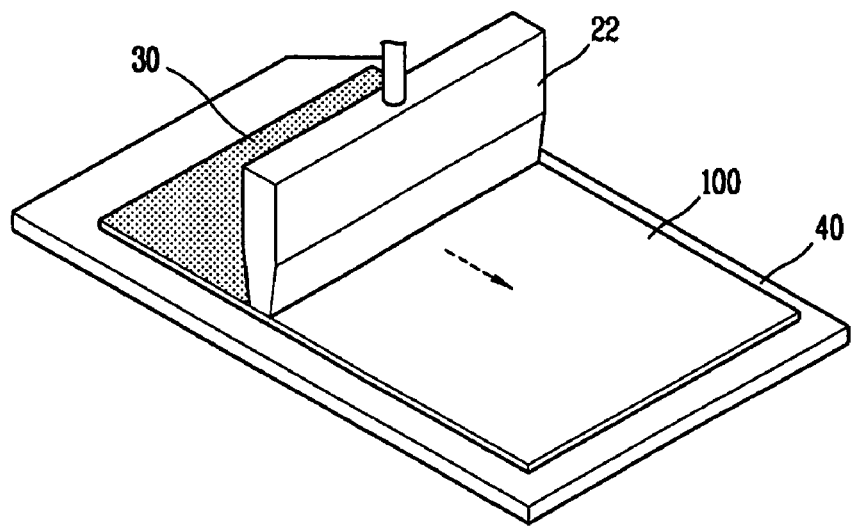

FIGS. 2A and 2B are exemplary views which illustrate a basic concept of a slit coater and the application of the photosensitive solution by the slit coater.

As shown, in accordance with an embodiment of the invention, the slit coater is provided with a slit nozzle 22 having a narrow and long slit. Photosensitive solution 30 is supplied through the slit nozzle 22, thereby applying the photosensitive solution 30 on a surface of a substrate 100 in a plane form.

The slit coater is an apparatus that applies a certain amount of photosensitive solution 30 onto the substrate 100 or the like through a bar-shaped long slit nozzle 22. The slit coater applies a uniform amount of photosensitive solution 30 through a fine slit nozzle 22, moving from one side of the substrate 100 toward its other side at a constant speed, thereby forming a uniform photosensitive film on the surface of the substrate 100.

Also, because the slit coater can apply the photosensitive solution 30 only to a desired surface of the substrate 100, the coating solution can be used without being wasted as compared to the aforementioned spin coater. In addition, because the slit coater can apply the coating solution in a plane form with a long width, it is suitable for a large substrate or a quadrangular substrate.

For reference element 40 indicates a table on which the substrate 100 is mounted, and the arrow indicates a direction in which the photosensitive solution 30 is applied along a direction that the slit nozzle 22 moves.

As the slit coater in accordance with the present invention has a pre-applying unit for the pre-applying operation performed before or after the coating solution is applied to an object to be processed such as a glass substrate, a spreading condition is constantly maintained to obtain the best spreading condition. This will now be described with reference to accompanying drawings.

Figure 3:
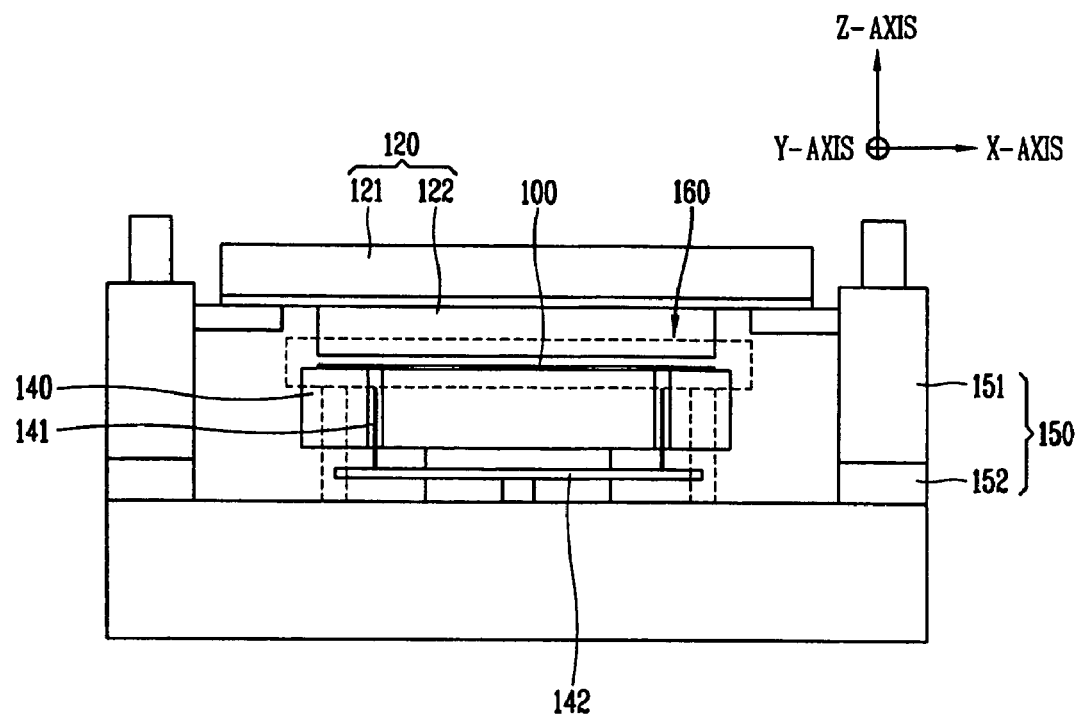
FIG. 3 is a schematic front view which illustrates a slit coater provided with a pre-applying unit in accordance with an embodiment of the present invention.

FIG. 3 is a schematic front view which is a slit coater having a pre-applying unit in accordance with the embodiment of the present invention.

As shown, the slit coater in accordance with the present embodiment includes a table 140 on which a substrate 100 is mounted, a slit nozzle unit 120 applying a coating solution, such as a photosensitive solution, onto the substrate 100, and a driving unit 150 installed at both ends of the slit nozzle unit 120 and configured to move the slit nozzle 120 at a constant speed.

The driving unit 150 includes a pair of Z-axial driving apparatuses 151 installed at both ends of the slit nozzle unit 120 and moving the slit nozzle unit 120 up and down, and a pair of Y-axial driving apparatuses 152 moving the slit nozzle unit 120 back and forth across the table 140 at a constant speed to uniformly apply the photosensitive solution to a surface of the substrate 100.

Here, each Y-axial driving apparatus 152 may includes a motor (not shown), and a transfer unit (not shown) such as a transfer rail and a guide rail. A non-contact type linear motor can be used as the motor.

An object 100 such as a glass substrate is mounted onto the table 140, and a plurality of pins 141 for lifting up the substrate 100 from the table 140 are installed inside the table 140. The pins 140 are supported by a plate 142 placed under the table 140 so as to mount of lift the substrate 100 onto or from the table 140 by the vertical movement of the plate 142.

The slit nozzle unit 120 includes a nozzle 122 located above the substrate 100 and crossing the substrate 100 and has the shape of a slit with a length corresponding to a width of the substrate 100, and a head 121 to which the slit nozzle 122 is mounted.

Although not shown in detail in the drawing, the slit nozzle 122 includes a nozzle body, an inlet and an outlet, wherein the nozzle body has a receiving space for storing a photosensitive solution therein. The inlet is formed at the nozzle body and the outlet is formed at a surface of the nozzle body, which faces the substrate 100. The outlet has the shape of slit with a length longer than its width.

The slit nozzle 122 applies the photosensitive solution, moving from one side toward the other side of the substrate 100 by the Y-axial driving apparatuses 152, thereby uniformly applying the photosensitive solution on the surface of the substrate 100. Also, the photosensitive solution may be applied to the substrate by sliding the substrate 100 relative to the slit nozzle 122 which remains in a fixed position.

Although not shown in the drawing, a bubble outlet for removing bubbles within the slit nozzle 122 can be included at an upper end of the head 121 of the slit nozzle unit 120.

When coating solution is consecutively applied on surfaces of a plurality of substrates by using the slit coater, the concentration of the coating solution within the slit nozzle 122 is increased during a waiting period between applying processes. If the applying process is performed on the next substrate 100 in such a state, application defects, such as generating a vertical line on a coating film applied by the highly-concentrated coating solution, or cracks may occur.

Thus, the slit coater in accordance with the present invention additionally includes a pre-applying unit 160 for the pre-applying, so that the highly-concentrated coating solution within the slit nozzle 122 is discharged and discarded before or after the application process. Therefore, the defective application can be prevented. This will now be described in detail with reference to accompanying drawings. In the drawing, the case where the pre-applying unit 160 is installed at a front portion of the table 140 is taken as an example, but the present invention is not limited thereby and the pre-applying unit 160 of the present invention may be installed at a rear portion or a side surface of the table 140.

Figure 4:
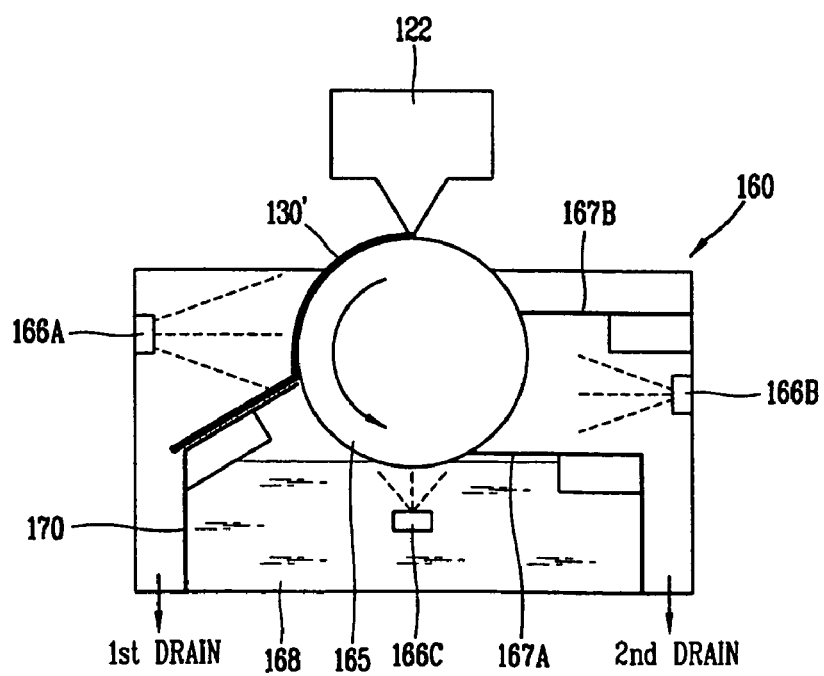
FIG. 4 is a schematic sectional view which illustrates the pre-applying unit of FIG. 3.

FIG. 4 is a schematic sectional view of the pre-applying unit 160 in accordance with an embodiment of the present invention, which is viewed from the side of the pre-applying unit of FIG. 3.

As shown, the pre-applying unit 160 in accordance with the present embodiment includes a washing container 168 filled with a washing solution, a rotating roller 165 disposed horizontally with respect to the washing container 168, wherein a lower portion of the rotating roller 165 is immersed in the washing solution within the washing container and its upper portion is exposed to approach the slit nozzle 122, and washing solution spray nozzles 166A~166C spraying the washing solution toward the surface of the rotating roller 165.

Both ends of the cylindrical rotating roller 165 are rotatably installed at both side walls facing each other and formed vertically on a bottom of the washing container. Although not shown in the drawing, a pulley is mounted at one end of a shaft of the rotating roller 165, and the pulley and a rotating shaft of a motor are coupled together by a belt, so that a driving force of the motor is transferred to the rotating roller 165 through the belt.

The rotating roller 165 may be formed of metal such as stainless steel, aluminum, titanium, or the like.

As described above, washing solution such as a highly-volatile organic solvent is filled in the washing container 168 of the pre-applying unit 160, and the lower portion of the rotating roller 165 is immersed in the washing solution.

Also, first and second washing solution spray nozzles 166A and 166B for spraying the washing solution toward the surface of the rotating roller 165 are installed at both side walls of the pre-applying unit 160. A third washing solution spray nozzle 166C is installed within the washing container 168 under the rotating roller 165.

Figure 5:
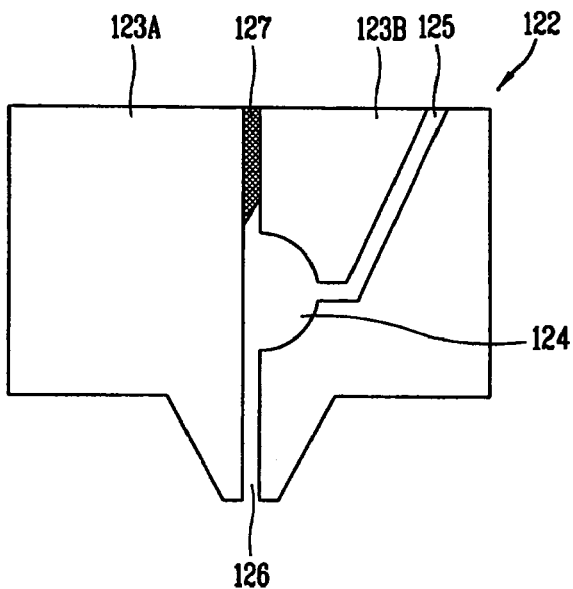
FIG. 5 is a schematic sectional view which illustrates a structure of the slit nozzle.

Referring to FIG. 5, the slit nozzle 122 which pre-applies a certain amount of photosensitive solution to the pre-applying unit 160 includes a first nozzle body 123A, a second nozzle body 123B, an inlet 125 and an outlet 126.

The slit nozzle 122 has a structure in which two nozzle bodies 123A and 123B are coupled, and a receiving space 124 for temporarily storing a certain amount of photosensitive solution is formed between the first nozzle body 123A and the second nozzle body 123B in order to uniformly spray the photosensitive solution pressurized by a pumping unit.

In the illustrated embodiment, the inlet 125 is formed at an upper portion of the second nozzle body 123B and supplies the photosensitive solution to the receiving space 124, and the outlet 126 has a slit shape having a length longer than its width and is formed at a lower portion of the nozzle bodies 123A and 123B facing the substrate, thereby applying the photosensitive solution to the surface of the substrate 100 in a plane form.

A gap between the first nozzle body 123A and the second nozzle body 123B is determined and maintained by a very thin shim 127 of stainless steel.

Before or after the application process, the pre-applying unit 160 of the present embodiment can prevent the aforementioned defective application. Referring back to FIG. 4, in one method, the outlet 126 of the slit nozzle 122 approaches a surface of the rotating roller 165, applies the highly-concentrated photosensitive solution 130' to the pre-applying unit 160, and thusly allows the photosensitive solution with certain concentration to remain in the slit nozzle 122.

In order to always maintain the best spreading condition, before or after the photosensitive solution is applied onto the glass substrate 100, the highly-concentrated photosensitive solution 130' is applied through the outlet 126 of the slit nozzle 122 in a state that a uniform interval between the outlet 126 and the rotating roller 165 is maintained.

In the illustrated embodiment, the photosensitive solution 130' applied onto the surface of the rotating roller 165 is diluted by washing solution sprayed from the first washing solution spray nozzle 166A, and then is discharged to a photosensitive solution drain ($1^{st}$ drain) through a photosensitive solution separating unit 170 formed at a lower end of the left side of the washing container 168. One end portion of the photosensitive solution separating unit 170 is adjacent to the surface of the rotating roller 165 so as to separate the spread photosensitive solution 130' from the washing solution and discharge the photosensitive solution.

Although the case where the photosensitive solution separating unit 170 is installed at the lower end of the left side of the washing container 168 is taken as an example in the drawing, the present invention is not limited thereby, and its installation position is determined by a direction in which the rotating roller 165 rotates. Specifically, if the rotating roller 165 rotates counterclockwise, the photosensitive solution separating unit 170 is installed at the left side as shown in FIG. 4 and, if the rotating roller 165 rotates clockwise, the photosensitive solution separating unit 170 may be installed at the right side. Also, the photosensitive solution separating unit 170 may be installed at an upper side or a lower side to separate the photosensitive solution 130' from the washing solution.

Because a certain amount of washing solution always stays in the washing container 168 of the pre-applying unit 160, a part of the rotating roller 165 is immersed in the washing solution, so that some photosensitive solution 130' which has not been removed by the photosensitive solution separating unit 170 can be washed.

The third washing solution spray nozzle 166C installed at a lower portion of the washing container 168 and the second washing solution spray nozzle 166B installed at a right side of the pre-applying unit 160 are for diluting and removing some remaining photosensitive solution 130'. A first photosensitive solution removing unit 167A and a second photosensitive solution removing unit 167B installed under and above the second washing solution spray nozzle 166B, respectively, are for removing the remaining photosensitive solution 130' and the lastly-sprayed washing solution.

Although the case where the first photosensitive solution removing unit 167A is installed at the right side wall of the washing container 168 is taken as an example in the drawing, the present invention is not limited thereby and the first photosensitive solution removing unit 167A may be installed at the right side wall of the pre-applying unit 160 like the second photosensitive solution removing unit 167B. A drain ($2^{nd}$ drain) for discharging extra washing solution within the washing container 168 is installed between a side wall of the pre-applying unit 160 and the washing container 168 where the first photosensitive solution removing unit 167A is installed.

The first washing solution spray nozzle 166A and the second washing solution spray nozzle 166B may be installed at the side wall of the pre-applying unit 160 by using a screw member (not shown) as a medium, and a bubbling nozzle may be used as the third washing solution spray nozzle 166C installed at the washing container 168.

In one bubbling nozzle washing method, photosensitive solution 130' attached to the rotating roller 165 is washed away by spouting a certain amount of washing solution as a playing fountain does and washing away the photosensitive solution 130' using a bubble-like washing solution including gas.

In the pre-applying unit 160 of the present embodiment, one end portion of the photosensitive solution separating unit 170 is adjacent to the rotating roller 165 in the pre-applying unit so as to separate the highly-concentrated photosensitive solution 130' having been spread to the surface of the rotating roller 165 from the washing solution and discharge the separated photosensitive solution 130'. Thus, the highly-concentrated photosensitive solution 130' is not mixed with the washing solution, thereby preventing the washing solution from being polluted by the photosensitive solution. As a result, washing effect of the rotating roller 165 can be improved when the washing solution is reused, and the number of times the washing solution is reused is increased.

Figure 6:
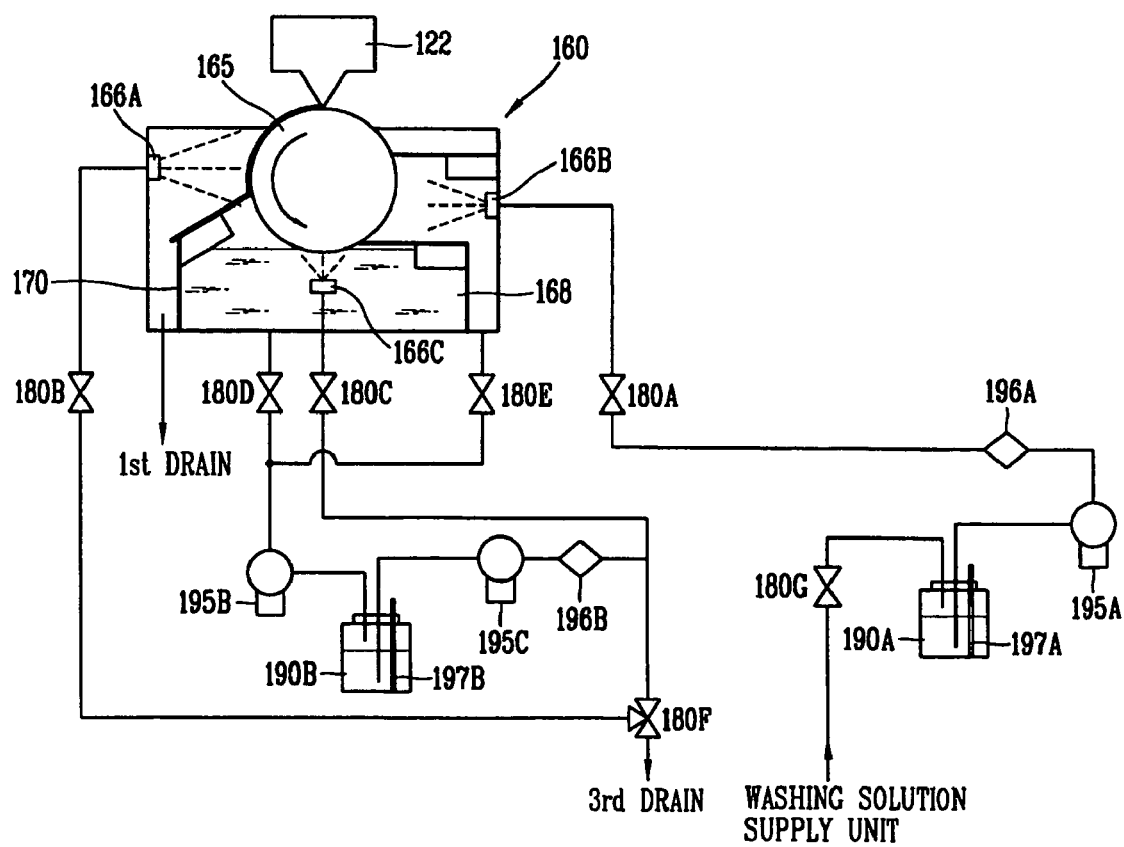
FIG. 6 is a schematic plan view of a line system including the pre-applying unit in accordance with the embodiment of the present invention.

FIG. 6 is a schematic plan view of a line system including the pre-applying unit in accordance with the embodiment of the present invention.

As shown, the system for the pre-applying unit 160 includes a first storage tank 190A for storing new clean washing solution, a second storage tank 190B for storing used washing solution required to be collected and discharged, a plurality of pumps 195A~195C for transferring the washing solution between the storage tanks 190A and 190B and the pre-applying unit 160, and various control apparatuses including a plurality sensors 197A and 197B and a plurality of valves 180A~180G. The washing solution can be reused depending upon user's choice.

New washing solution stored in the first storage tank 190A is supplied to the second washing solution spray nozzle 166B of the pre-applying unit 160 by the operation of a supply pump 195A, and a first filter 196A for filtering impurities, and a first valve 180A installed between the supply pump 195A and the second washing solution spray nozzle 166B.

In the illustrated embodiment, a first level sensor 197A for measuring the amount of residual washing solution is attached to the first storage tank 190A, and sends a signal to a control apparatus (not shown) when detecting a shortage of the washing solution. As the control apparatus sends the signal to a seventh valve 180G, the first storage tank receives new washing solution from a washing solution supply unit.

The new washing solution filled in the first storage tank 190A through the washing solution supply unit is supplied to the second washing solution spray nozzle 166B to be used only for the final washing for the rotating roller 165.

Some of washing solution sprayed by the second washing solution spraying nozzle 166B is introduced to the drain ($2^{nd}$ drain shown in FIG. 4) and is collected in the second storage tank 190B through a drain pump 195B. The used washing solution within the washing container 168 is also stored in the second storage tank 190B through the drain pump 195B.

The washing solution collected in the second storage tank 190B by the drain pump 195B may be supplied by a transfer pump 195C to the third washing solution spray nozzle 166C that washes a lower portion of the rotating roller 165 or may be reused by being supplied to the first washing solution spray nozzle 166A formed at an upper end of the left size so as to dilute the photosensitive solution.

The washing solution having been used to dilute the highly-concentrated photosensitive solution through the first washing solution spray nozzle 166A is discharged right after the dilution.

In the illustrated embodiment, a third valve 180C and a second filter 196B for filtering washing solution being supplied to the drain pump 195B are installed between the transfer pump 195C and the third washing solution spray nozzle 166C. A fourth valve 180D is installed between the washing container 168 and the drain pump 195B, and a fifth valve 180E is installed between $2^{nd}$ drain and the drain pump 195B.

Also, a second valve 180B and a sixth valve 180F are installed between the second filter 196B and the first washing solution spray nozzle 166A. The washing solution may be discharged to a washing solution drain ($3^{rd}$ drain) through the sixth valve 180F instead of being reused depending upon user's choice.

The pre-applying unit of the present embodiment can greatly improve washing efficiency by performing separated washing according to the usage of the washing solution, as compared to the related art. Also, only the washing solution used to dilute the photosensitive solution of the washing solution used to wash the rotating roller once is discharged, and only new clean washing solution is always used for the final washing, so that the washing effect can be maximized.

Also, because the washing solution used for the lower portion of the rotating roller is also in a state that the photosensitive solution is filtered, the washing solution can be maintained more cleanly.

As the present invention may be embodied in several forms without departing from the spirit or essential characteristics thereof, it should also be understood that the above-described embodiments are not limited by any of the details of the foregoing description, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A method for fabricating an LCD substrate using a slit coater, the method comprising:
providing a table on which an LCD substrate is mounted;
providing a slit nozzle configured to apply a coating solution onto a surface of the LCD substrate;
providing a pre-applying unit including a washing container filled with washing solution, a rotating roller disposed in the washing container and configured to receive pre-applied coating solution from the slit nozzle, first, second, and third washing solution spray nozzles installed at one side, the opposite side, and a lower portion of the washing container, respectively, pre-applying coating solution removing units installed under and above the second washing solution spray nozzle, respectively, a pre-applied coating solution drain ($1^{st}$ drain) installed outside the washing container, a drain ($2^{nd}$ drain) for discharging extra washing solution within the washing container and a coating solution separating unit, wherein one end portion of the coating solution separating unit is adjacent to a surface of the rotating roller;
pre-applying a coating solution onto the surface of the rotating roller before or after the coating solution is applied onto the surface of the LCD substrate;
$1^{st}$ diluting the pre-applied coating solution by spraying washing solution from the first washing solution spray nozzle;
discharging at least some of the $1^{st}$ diluted pre-applied coating solution to the $1^{st}$ drain through the coating solution separating unit;
washing some remaining $1^{st}$ diluted pre-applied coating solution through the washing solution in the washing container;
$2^{nd}$ diluting and removing some remaining washed $1^{st}$ diluted pre-applied coating solution by the second and third washing solution spray nozzles and the pre-applying coating solution removing units;
providing a first storage tank for storing new washing solution and a second storage tank for storing used washing solution;
supplying the new washing solution to the second washing solution spray nozzle;
discharging the extra washing solution within the washing container to the $2^{nd}$ drain and collecting the extra washing solution in the second storage tank through a drain pump;
supplying the collected extra washing solution to the first and third washing solution spray nozzles through a transfer pump;
providing a third valve and a second filter installed between the transfer pump and the third washing solution spray nozzle for filtering washing solution being supplied to the drain pump;
providing a fourth valve installed between the washing container and the drain pump and a fifth valve installed between the $2^{nd}$ drain and the drain pump;
providing a second valve and a sixth valve installed between the second filter and the first washing solution spray nozzle;
providing a washing solution drain ($3^{rd}$ drain) configured to discharge the used washing solution through the sixth valve instead of being reused depending upon user's choice; and
applying the coating solution to the LCD substrate.

2. The method of claim 1 further comprising:
providing a supply pump configured to supply the new washing solution to the second washing solution spray nozzle.

3. The method of claim 2 further comprising:
providing a line coupling the supply pump to the second washing solution spray nozzle; and
providing a filter in the line and configured to substantially remove impurities of the washing solution.

4. The method of claim 1, wherein the washing solution comprises a highly volatile organic solvent.

5. The method of claim 1 further comprising providing a driving unit and driving the slit nozzle in a predetermined direction over the LCD substrate.

* * * * *